United States Patent
Nishiyama et al.

(10) Patent No.: US 10,622,212 B2
(45) Date of Patent: Apr. 14, 2020

(54) SEMICONDUCTOR DEVICE MANUFACTURING METHOD AND SEMICONDUCTOR DEVICE

(71) Applicant: FUJI ELECTRIC CO., LTD., Kanagawa (JP)

(72) Inventors: Katsushi Nishiyama, Matsumoto (JP); Masayuki Miyazaki, Matsumoto (JP); Shoji Kitamura, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/986,820

(22) Filed: May 23, 2018

(65) Prior Publication Data

US 2018/0301337 A1 Oct. 18, 2018

Related U.S. Application Data

(63) Continuation of application No. PCT/JP2017/016448, filed on Apr. 25, 2017.

(30) Foreign Application Priority Data

Jun. 24, 2016 (JP) .................... 2016-125454

(51) Int. Cl.
H01L 21/04 (2006.01)
H01L 29/36 (2006.01)
H01L 29/66 (2006.01)
H01L 29/872 (2006.01)
H01L 29/16 (2006.01)

(52) U.S. Cl.
CPC ........ H01L 21/0465 (2013.01); H01L 21/046 (2013.01); H01L 29/36 (2013.01);
(Continued)

(58) Field of Classification Search
None
See application file for complete search history.

(56) References Cited

U.S. PATENT DOCUMENTS 5,374,564 A 12/1994 Bruel
2001/0046757 A1* 11/2001 Takahashi ............. H01L 21/046
438/518

(Continued)

FOREIGN PATENT DOCUMENTS

JP H05211128 A 8/1993
JP H07105902 A 4/1995
(Continued)

OTHER PUBLICATIONS

Kimoto et al., "Device Processing of Silicon Carbide", Fundamentals of Silicon Carbide Technology: Growth, Characterization, Devices, and Applications, First Edition.; John Wiley and Sons Singapore Pte Ltd. Published 2014, pp. 189-200 (Year: 2014).*

(Continued)

Primary Examiner — Shaun M Campbell

(57) ABSTRACT

To enhance efficiency of a process of implanting impurities into a silicon carbide semiconductor layer. To provide a method of manufacturing a semiconductor device including a silicon carbide semiconductor layer, the method of manufacturing including: implanting impurities multiple times to an impurity implantation region in the silicon carbide semiconductor layer to different depths, with temperature of the silicon carbide semiconductor layer being set to be equal to or lower than 150° C. In the implanting, impurities may be implanted multiple times to the impurity implantation region to different depths, with temperature of the silicon carbide semiconductor layer being set to be equal to or higher than room temperature.

13 Claims, 8 Drawing Sheets

(52) U.S. Cl.
CPC ...... *H01L 29/6606* (2013.01); *H01L 29/1608* (2013.01); *H01L 29/872* (2013.01)

(56) References Cited

U.S. PATENT DOCUMENTS

| | | |
|---|---|---|
| 2009/0250705 A1 | 10/2009 | Watanabe et al. |
| 2014/0246755 A1 | 9/2014 | Yoshimura et al. |
| 2014/0256755 A1* | 9/2014 | Kwokal ............... C07D 413/12 514/269 |
| 2014/0353683 A1 | 12/2014 | Ishimabushi et al. |
| 2016/0254148 A1* | 9/2016 | Kitamura ................ H01L 29/32 257/77 |
| 2018/0166279 A1* | 6/2018 | Tamura .................. H01L 29/32 |
| 2019/0148500 A1* | 5/2019 | Agata ..................... H01L 29/36 257/655 |

FOREIGN PATENT DOCUMENTS

| | | |
|---|---|---|
| JP | 2001015760 A | 1/2001 |
| JP | 2001332508 A | 11/2001 |
| JP | 2002261041 A | 9/2002 |
| JP | 2008244435 A | 10/2008 |
| JP | 2009252811 A | 10/2009 |
| JP | 2011204817 A | 10/2011 |
| JP | 2014236120 A | 12/2014 |
| WO | 2013100155 A1 | 7/2013 |
| WO | 2015064256 A1 | 5/2015 |

OTHER PUBLICATIONS

International Search Report for International Patent Application No. PCT/JP2017/016448, issued by the Japan Patent Office dated Jun. 27, 2017.

* cited by examiner

SEMICONDUCTOR DEVICE MANUFACTURING METHOD AND SEMICONDUCTOR DEVICE

The contents of the following Japanese patent application(s) are incorporated herein by reference:
No. 2016-125454 filed in JP on Jun. 24, 2016, and
PCT/JP2017/016448 filed on Apr. 25, 2017.

BACKGROUND

1. Technical Field

The present invention relates to a semiconductor device manufacturing method and a semiconductor device.

2. Related Art

Conventionally known semiconductor devices include one using silicon carbide (referred to as SiC in the present specification, in some cases). Ion implantation has been known as an impurity implantation process for forming a device structure in a SiC substrate (please see Patent Document 1, for example).

[Patent Document 1] Japanese Patent Application Publication No. 2009-252811

In order to suppress generation of crystal defects at the time of ion implantation, the substrate temperature at the time of ion implantation is set to approximately 175° C. to 500° C. Although generation of crystal defects can be suppressed by setting the substrate temperature to a high temperature, it takes time to raise and lower the substrate temperature.

General Disclosure

A first aspect of the present invention provides a method of manufacturing a semiconductor device including a silicon carbide semiconductor layer. The method of manufacturing may include implanting impurities to an impurity implantation region in the silicon carbide semiconductor layer, with temperature of the silicon carbide semiconductor layer being set to be equal to or lower than 150° C. In the implanting, impurities may be implanted multiple times to the impurity implantation region in the silicon carbide semiconductor layer to different depths.

In the implanting, impurities may be implanted multiple times to the impurity implantation region to different depths, with temperature of the silicon carbide semiconductor layer being set to be equal to or higher than room temperature. In the implanting, impurities may be implanted multiple times to the impurity implantation region to different depths, with the silicon carbide semiconductor layer being arranged in a room temperature atmosphere.

In the implanting, impurities may be implanted such that an impurity concentration of the impurity implantation region becomes equal to or higher than $1.0 \times 10^{16}/cm^3$ and equal to or lower than $5.0 \times 10^{19}/cm^3$. In the implanting, impurities may be implanted such that the impurity concentration of the impurity implantation region becomes equal to or lower than $1.0 \times 10^{18}/cm^3$.

An impurity concentration distribution in a depth direction of the impurity implantation region to which the impurities are implanted in the implanting may have a plurality of peaks and a plurality of valleys. A proportion of an impurity concentration of a first valley which is among the plurality of valleys and is deepest as seen from an implantation surface of the silicon carbide semiconductor layer to which the impurities are implanted to an impurity concentration of a first peak which is among the plurality of peaks and is deepest as seen from the implantation surface may be equal to or higher than 10% and equal to or lower than 60%.

An interval $d_p$ in the depth direction between respective peaks in the impurity concentration distribution may satisfy the following equation (3):

[Equation 3]

$$0.1 \leq \exp\left(-\frac{d_p^2}{2(\sigma_1 + \sigma_2)^2}\right) \leq 0.6 \quad (3)$$

where a standard deviation of the impurity concentration distribution of a peak that is among the plurality of adjacent peaks and is on a deeper side in the depth direction is $\sigma_1$, and a standard deviation of the impurity concentration distribution of a peak that is among the plurality of adjacent peaks and is on a shallower side in the depth direction is $\sigma_2$.

Intervals, in the depth direction, between respective peaks in the impurity concentration distribution may increase as depths of the peaks as seen from an implantation surface of the silicon carbide semiconductor layer to which the impurities are implanted increase. An impurity concentration of a peak that is deepest as seen from the implantation surface of the silicon carbide semiconductor layer to which the impurities are implanted may be higher than an impurity concentration of a second deepest peak.

A total dose in the implanting may be equal to or lower than $6.0 \times 10^{14}/cm^2$. The total dose in the implanting may be equal to or lower than $1.55 \times 10^{14}/cm^2$. A depth of a first peak that is among the plurality of peaks and is deepest as seen from the implantation surface of the silicon carbide semiconductor layer to which the impurities are implanted may be equal to or larger than 0.2 μm and equal to or smaller than 1.0 μm. Prior to the implanting, forming, above the silicon carbide semiconductor layer, a resist mask in a shape corresponding to the impurity implantation region may be included.

A second aspect of the present invention provides a semiconductor device including a silicon carbide semiconductor layer. The silicon carbide semiconductor layer may have an impurity implantation region to which impurities are implanted. An impurity concentration distribution in a depth direction of the impurity implantation region may have a plurality of peaks and a plurality of valleys. Intervals, in the depth direction, between respective peaks in the impurity concentration distribution may increase as depths of the peaks as seen from an implantation surface of the silicon carbide semiconductor layer to which the impurities are implanted increase.

In an impurity concentration distribution in the depth direction of the impurity implantation region, an impurity concentration of a peak that is deepest as seen from the implantation surface of the silicon carbide semiconductor layer to which the impurities are implanted may be higher than an impurity concentration of a second deepest peak.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
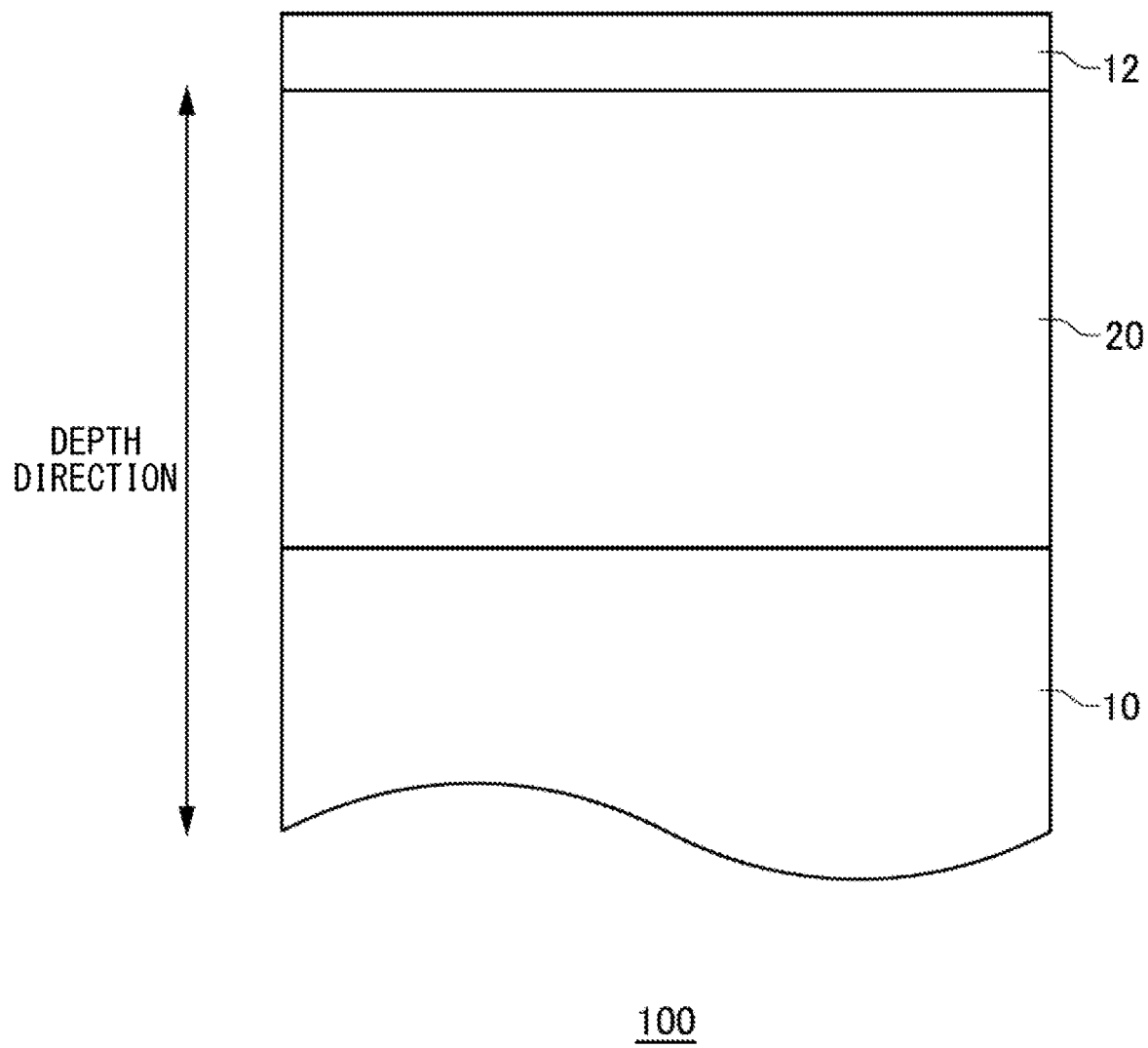
FIG. 1 is a cross-sectional view showing the summary of a semiconductor device 100 according to one embodiment of the present invention.

FIG. 1 is a cross-sectional view showing the summary of a semiconductor device 100 according to one embodiment of the present invention. The semiconductor device 100 includes a SiC semiconductor layer 10. The SiC semiconductor layer 10 may be at least part of a SiC substrate or may be a semiconductor layer formed on a substrate by epitaxy or the like.

The semiconductor device 100 functions as a diode, a transistor or another semiconductor element. The semiconductor device 100 of the present example is a Schottky barrier diode, and includes the SiC semiconductor layer 10 and an electrode 12. In another example, the semiconductor device 100 is an IEMOS (Implantation and Epitaxial Metal Oxide Semiconductor) formed by epitaxially growing a SiC layer above a SiC layer to which impurities are implanted. However, the semiconductor device 100 is not limited to these examples. FIG. 1 shows only a portion near the upper surface of the semiconductor device 100, and other portions are omitted.

The SiC semiconductor layer 10 of the present example is a SiC substrate. The SiC semiconductor layer 10 has an impurity implantation region 20 to which impurities are implanted. The impurity implantation region 20 functions as a predetermined impurity region in the semiconductor device 100. For example, the impurity implantation region 20 may function as an n-type region or may function as a p-type region. Impurities corresponding to conductivities are implanted to the impurity implantation region 20. More specifically, the impurity implantation region 20 may function as the emitter region, collector region, source region or drain region of a transistor, may function as the base region (channel region) of a MOS transistor or may function as the anode region or cathode region of a diode.

In the present example, the impurity implantation region 20 functions as the anode region or cathode region of a diode. The impurity implantation region 20 of the present example is formed in a region contacting the electrode 12. The electrode 12 of the present example is a Schottky electrode that is formed at the upper surface of the SiC semiconductor layer 10, and forms a Schottky junction with the impurity implantation region 20. As one example, the electrode 12 is formed of platinum (Pt). The direction perpendicular to the upper surface of the SiC semiconductor layer 10 at which the electrode 12 is formed is referred to as the depth direction.

Figure 2:
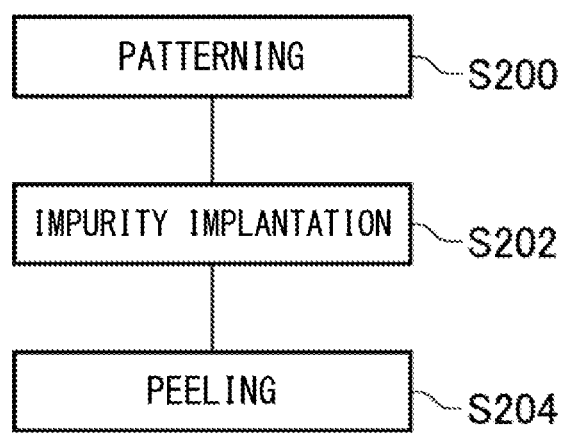
FIG. 2 is a figure showing an example process of implanting impurities to an impurity implantation region 20 among processes of manufacturing the semiconductor device 100.

FIG. 2 is a figure showing an example process of implanting impurities to the impurity implantation region 20 among processes of manufacturing the semiconductor device 100. A process of implanting impurities of the present example is performed prior to forming the electrode 12. First, at a mask formation step S200, a mask subjected to patterning to have a shape corresponding to the impurity implantation region 20 is formed on the upper surface of the SiC semiconductor layer 10. At the mask formation step S200 of the present example, after forming a mask layer over the entire upper surface of the SiC semiconductor layer 10, a mask layer is formed by patterning by a process such as exposure or development. The mask in the present example is a resist mask.

Next, at an impurity implantation step S202, impurities are implanted multiple times to the impurity implantation region 20 of the SiC semiconductor layer 10 to different depths, with temperature of the SiC semiconductor layer 10 being set to be equal to or lower than 150° C. At the impurity implantation step S202, impurities are implanted to the impurity implantation region 20 treating the upper surface of the SiC semiconductor layer 10 as an implantation surface.

Because at the impurity implantation step S202, temperature of the SiC semiconductor layer 10 is set to be equal to or lower than 150° C., time required to raise or lower the temperature of the SiC semiconductor layer 10 can be made shorter. Because of this, the production efficiency of the semiconductor device 100 can be improved. Temperature of the SiC semiconductor layer 10 at the impurity implantation step S202 may be equal to or lower than 120° C. or may be equal to or lower than 100° C.

Temperature of the SiC semiconductor layer 10 at the impurity implantation step S202 may be set to be equal to or higher than room temperature. Room temperature is temperature of a space in which an ion implantation apparatus is arranged, and for example is temperature which is approximately equal to or higher than 20° C. and equal to or lower than 30° C.

At the impurity implantation step S202 of the present example, impurities are implanted multiple times to the impurity implantation region 20 to different depths, with the SiC semiconductor layer 10 being arranged in a room temperature atmosphere. At the impurity implantation step S202, impurities may be implanted to the respective depths in the descending order of the depths or may be implanted to the respective depths in the ascending order of the depths.

Temperature of the SiC semiconductor layer 10 may increase due to impurities being implanted to the SiC semiconductor layer 10. Even if temperature of the SiC semiconductor layer 10 increases due to impurity implantation, temperature of the SiC semiconductor layer 10 may be controlled such that temperature of the SiC semiconductor layer 10 is equal to or lower than 150° C. Thereby, time required to raise or lower temperature of the SiC semiconductor layer 10 can be made shorter.

Temperature of the SiC semiconductor layer 10 at the impurity implantation step S202 is set to be equal to or lower than 150° C. Because of this, a relatively less heat-resistant resist can be used as a mask formed at the upper surface of the SiC semiconductor layer 10. If impurities are to be implanted to the SiC semiconductor layer 10 at a high temperature state, a highly heat-resistant mask such as an oxide film needs to be used. But use of an oxide film or the like as a mask results in increase in the number of processes at the mask formation step S200. For example, it becomes necessary to form an oxide film, perform a resist on the oxide film by patterning, etch the oxide film, peel the resist and then implant impurities.

In contrast to this, in the present example, because a resist mask can be used as a mask for impurity implantation, the number of processes at the mask formation step S200 can be reduced. Because of this, the manufacturing efficiency of the semiconductor device 100 can further be improved.

Next, at a peeling step S204, the resist mask is peeled. At the peeling step S204, the resist mask may be peeled by ashing.

At the impurity implantation step S202, it is preferable to suppress generation of crystal defects at the time of impurity implantation by controlling the impurity total dose or the like. Thereby, even if impurities are implanted to the SiC semiconductor layer 10 at temperature which is equal to or lower than 150° C., increase in crystal defects at the SiC semiconductor layer 10 can be reduced.

Figure 3:
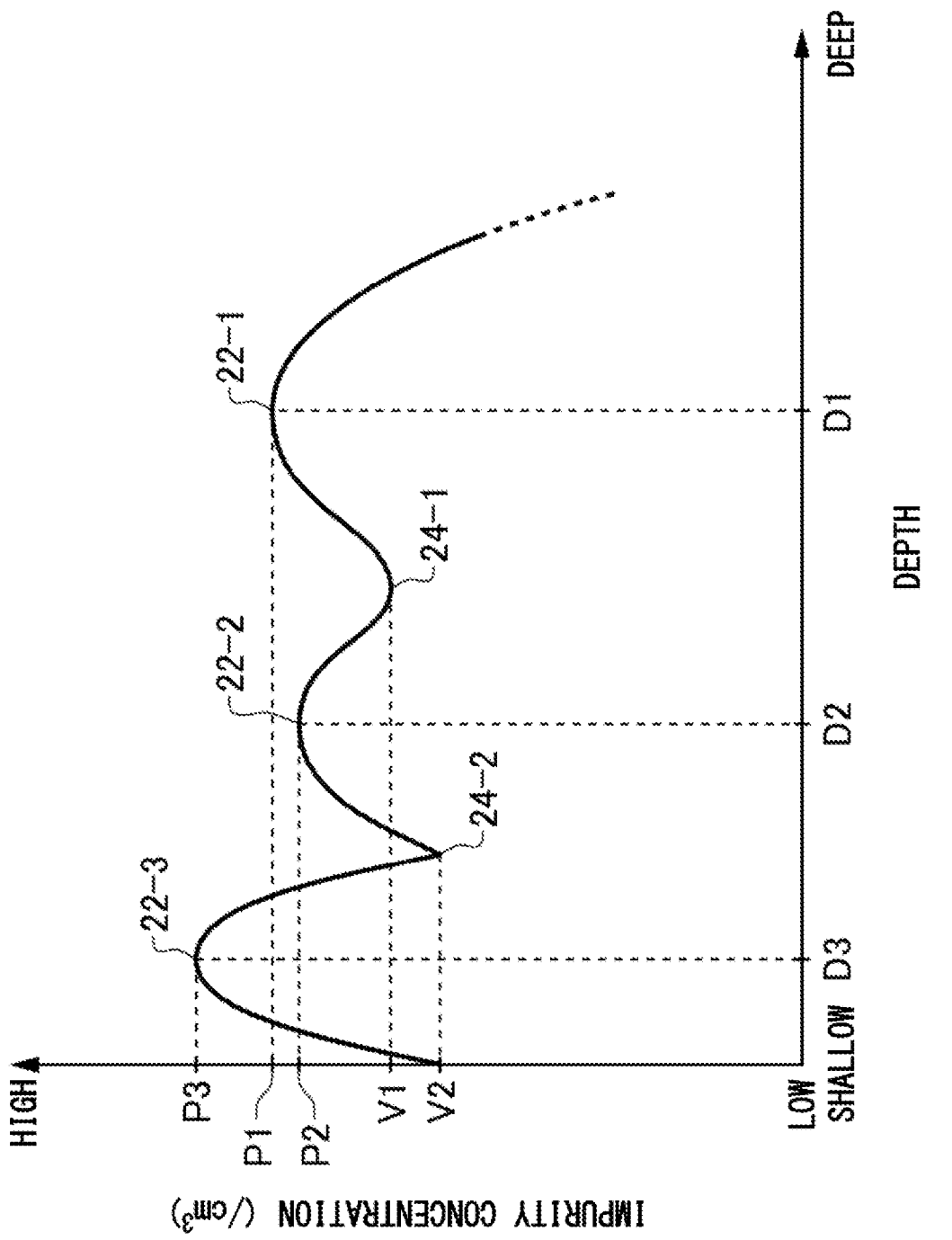
FIG. 3 is a figure showing an example impurity concentration distribution in the depth direction of the impurity implantation region 20.

FIG. 3 is a figure showing an example impurity concentration distribution in the depth direction of the impurity implantation region 20. In FIG. 3, the depth of the SiC semiconductor layer 10 as seen from the impurity implantation surface is shown along the horizontal axis, and the logarithm of the impurity concentration is shown along the vertical axis. In the present example, impurity ions are implanted three times to the impurity implantation region 20 to different depths.

The impurity concentration distribution in the impurity implantation region 20 can be approximated with Gaussian distributions having vertexes corresponding to concentrations at set implantation depths. Because in the present example, impurity ions are implanted three times to different depths, three Gaussian distributions overlap, and three peaks 22, and two valleys 24 are formed in the impurity concentration distribution. A peak is a point indicating a maximum value of the impurity concentration, and a valley is a point indicating a minimum value of the impurity concentration between two peaks.

In FIG. 3, the peaks 22 are denoted as a first peak 22-1, a second peak 22-2 and a third peak 22-3 in the descending order of the depths of the peaks 22 as seen from the impurity implantation surface. In addition, the valleys 24 are denoted as a first valley 24-1 and a second valley 24-2 in the descending order of the depths of the valleys 24 as seen from the impurity implantation surface.

If the impurity implantation region 20 functions as an impurity region such as an emitter region, impurities are generally implanted such that the impurity concentration distribution in the depth direction becomes as uniform as possible. For example, by implanting impurities many times at short intervals in the depth direction, a uniform impurity concentration distribution is formed. But if it is attempted to form a uniform impurity concentration distribution by implanting impurities many times, crystal defects increase.

In the present example, under a condition that satisfies a predetermined electrical characteristic, the degree of uniformity of the impurity concentration distribution in the impurity implantation region 20 is reduced. That is, the impurity concentrations of the valleys 24 are lowered in a predetermined range, relative to the impurity concentrations of the peaks 22. Thereby, even if the total dose or number of times of impurity implantation is reduced, and impurities are implanted at a low temperature, increase in crystal defects is suppressed.

Impurities are preferably implanted such that the impurity concentration of the impurity implantation region 20 is equal to or higher than $1.0 \times 10^{16}/cm^3$ and equal to or lower than $5.0 \times 10^{19}/cm^3$. The impurity concentrations of the impurity implantation region 20 are impurity concentrations P1 to P3 at the respective peaks 22 and impurity concentrations V1 to V2 at the valleys 24. That is, the impurity concentrations at all the peaks 22 and valleys 24 are preferably within the above-mentioned range.

If the impurity concentration is too low, this result in the impurity implantation region 20 not having a predetermined electrical characteristic. In addition, if the impurity concentrations is too high, this result in increase in the total dose, which leads to increase in crystal defects. In another example, the impurities may be implanted such that the impurity concentration of the impurity implantation region 20 is equal to or lower than $1.0 \times 10^{18}/cm^3$. Thereby, the total dose can further be reduced.

In addition, the proportion of the impurity concentration V1 of the first valley 24-1 to the impurity concentration P1 of the first peak 22-1 is desirably equal to or higher than 10% and equal to or lower than 60%. The first peak 22-1 is a peak 22 that is the deepest among the plurality of peaks 22 as seen from the impurity implantation surface. The first valley 24-1 is a valley 24 that is the deepest among the plurality of valleys 24 as seen from the impurity implantation surface. If the proportion of the impurity concentration V1 of the first valley 24-1 is too low, this results in a highly skewed impurity distribution in the impurity implantation region 20 and results in a highly skewed electric field distribution. Because of this, portions where current, electric charges and the like are prone to concentrate and portions where they are not prone to concentrate are generated in the impurity implantation region 20, and the withstand voltage of the semiconductor device 100 might lower. In addition, if the proportion of the impurity concentration V1 of the first valley 24-1 is too high, this results in the total dose or number of times of impurity implantation not being able to be reduced and results in increase in crystal defects.

The lower limit of the proportion of the impurity concentration V1 of the first valley 24-1 to P1 may be 20% or may be 30%. In addition, the upper limit of the proportion of the impurity concentration V1 of the first valley 24-1 to P1 may be 50% or may be 40%.

In addition, the proportion of the impurity concentration of another valley 24 to the impurity concentration of a peak 22 adjacent thereto on the deeper side is desirably equal to or higher than 10% and equal to or lower than 60%. The lower limit of the proportion may be 20% and may be 30%. The upper limit of the proportion may be 50% and may be 40%.

In addition, the intervals, in the depth direction, between the respective peaks 22 in the impurity implantation region 20 are obtained by the following Equation (1).

[Equation 1]

$$d_p(a) = \sqrt{2}(\sigma_1 + \sigma_2)\sqrt{\ln(a)^{-1}} \quad (1)$$

where the distance between adjacent peaks 22 is $d_p$, the proportion of the impurity concentration of a valley 24 which is between the adjacent peaks 22 to the impurity concentration of a peak 22 adjacent thereto on the deeper side is a, and the respective standard deviations of the impurity concentration distributions of the adjacent peaks 22 are $\sigma_1$ (the deeper side in the depth direction) and $\sigma_2$ (the shallower side in the depth direction). A standard deviation of an impurity concentration is determined by ion species and acceleration voltage.

In the example of FIG. 3, the respective depth positions of the first peak 22-1, second peak 22-2 and third peak 22-3 are assumed to be D1, D2 and D3. An interval D1-D2 and interval D2-D3 of the respective peaks 22 correspond to the interval between D1 and D2 and the interval between D2 and D3. $d_p$ in the above-mentioned Equation (1) corresponds to the interval D1-D2 and the interval D2-D3. If the interval $d_p$ in the above-mentioned Equation (1) is assumed to be the interval D1-D2, the proportion a indicates the proportion of the impurity concentration V1 of the first valley 24-1 to the impurity concentration P1 of the first peak 22-1. The standard deviation $\sigma_1$ indicates the standard deviation of the impurity concentration distribution of the peak 22-1, and the standard deviation $\sigma_2$ indicates the standard deviation of the impurity concentration distribution of the peak 22-2.

In addition, according to the above-mentioned Equation (1), the proportion a of the impurity concentration V of a valley 24 between adjacent peaks to the impurity concentration P of a peak 22 which is among the adjacent peaks 22 and is on the deeper side in the depth direction is obtained by the following Equation (2).

[Equation 2]
$$a = \exp\left(-\frac{d_p^2}{2(\sigma_1 + \sigma_2)^2}\right) \quad (2)$$

The proportion a of the impurity concentration V of a valley 24 between adjacent peaks 22 to the impurity concentration P of a peak 22 that is among the adjacent peaks 22 and is on the deeper side in the depth direction is desirably equal to or higher than 10% and equal to or lower than 60%, and the interval $d_p$ satisfies the following Equation (3).

[Equation 3]
$$0.1 \le \exp\left(-\frac{d_p^2}{2(\sigma_1 + \sigma_2)^2}\right) \le 0.6 \quad (3)$$

As one example, in the example to be shown, ion species in FIG. 3 are Al. If acceleration voltage of the first peak 22-1 is 150 eV, $\sigma_1$ is 0.04938, and if acceleration voltage of the second peak 22-2 is 30 eV, $\sigma_2$ is 0.01388. According to the above-mentioned Equations (2) and (3), in order to attain the proportion a of the impurity concentration V of a valley 24 between adjacent peaks 22 to the impurity concentration P of a peak 22 that is among the adjacent peaks and is on the deeper side in the depth direction which is equal to or higher than 10% and equal to or lower than 60%, the interval $d_p$ (the interval D1-D2) in the impurity implantation region 20 is equal to or larger than 0.06 μm and equal to or smaller than 0.13 μm.

In addition, if acceleration voltage of the first peak 22-1 is 350 eV, $\sigma_1$ is 0.08422, and if acceleration voltage of the second peak 22-2 is 150 eV, $\sigma_2$ is 0.04938. According to the above-mentioned Equations (2) and (3), in order to attain the proportion a of the impurity concentration V of a valley 24 between adjacent peaks 22 to the impurity concentration P of a peak 22 that is among the adjacent peaks and is on the deeper side in the depth direction which is equal to or higher than 10% and equal to or lower than 60%, the interval $d_p$ (the interval D1-D2) in the impurity implantation region 20 is equal to or larger than 0.13 μm and equal to or smaller than 0.28 μm.

Although in the present example shown, peaks are the first peak 22-1 and second peak 22-2, the intervals of other peaks 22 and valleys 24 can be set likewise according to the above-mentioned Equations (1), (2) and (3). By setting the intervals of respective peaks 22 in a range satisfying the above-mentioned Equation (3), it is possible to suppress generation, in the impurity implantation region 20, of portions where current, electric charges and the like are prone to concentrate and portions where they are not prone to concentrate, and to reduce the number of the peaks 22. The numbers of peaks 22 and valleys 24 may be varied by the depth of the impurity implantation region 20 formed.

In addition, as the depths as seen from the impurity implantation surface increase, the intervals, in the depth direction, between the respective peak 22 in the impurity concentration distribution may increase. In the present example, the interval D1-D2 between the first peak 22-1 and the second peak 22-2 is larger than the interval D2-D3 between the second peak 22-2 and the third peak 22-3. The deeper the depths of the peaks 22 as seen from the impurity implantation surface are, the larger the corresponding ranges of impurities are and the higher the degrees of variation in the corresponding depths to which impurities are implanted are.

That is, the deeper the depths of peaks 22 are, the higher the degrees of approximation of the corresponding impurity concentration distributions to a gentle Gaussian distribution are. Because of this, at relatively deep peaks 22, even if the intervals between the peaks 22 are increased, the impurity concentration of adjacent valleys 24 can be kept, and it is easier to preserve the uniformity of the impurity concentration distribution. That is, by increasing the intervals of peaks 22 at deep positions, it is possible to reduce the number of steps of impurity implantation, at the same time preserving the uniformity of the impurity concentration distribution.

As one example, the depths of the first peak 22-1, second peak 22-2 and third peak 22-3 may be equal to or smaller than 1.0 μm as seen from the impurity implantation surface. In addition, as one example, the depth of the first peak 22-1 may be equal to or larger than 0.2 μm and equal to or smaller than 1.0 μm as seen from the impurity implantation surface. The depth of the first peak 22-1 may be equal to or larger than 0.3 μm and equal to or smaller than 0.5 μm.

The depth of the second peak 22-2 may be equal to or larger than 0.1 μm and equal to or smaller than 0.3 μm. The depth of the third peak 22-3 may be equal to or larger than 0 μm and equal to or smaller than 0.1 μm.

In addition, the impurity concentration P1 of the first peak 22-1 that is the deepest as seen from the impurity implantation surface may be higher than the impurity concentration P2 of the second peak 22-2 that is the second deepest. As mentioned above, because as the depth of a peak 22 increases, variation occurs to the depths to which impurities are implanted, the impurity concentration of the entire peaks 22 are averaged, and the maximum value tends to be lower. In contrast to this, by setting the impurity concentration of the deepest peak 22 high, it is possible to suppress reduction of the impurity concentration of the peak 22 as compared with the impurity concentrations of other peaks 22. Because of this, it becomes easier to preserve the uniformity of the impurity concentration distribution.

Figure 4:
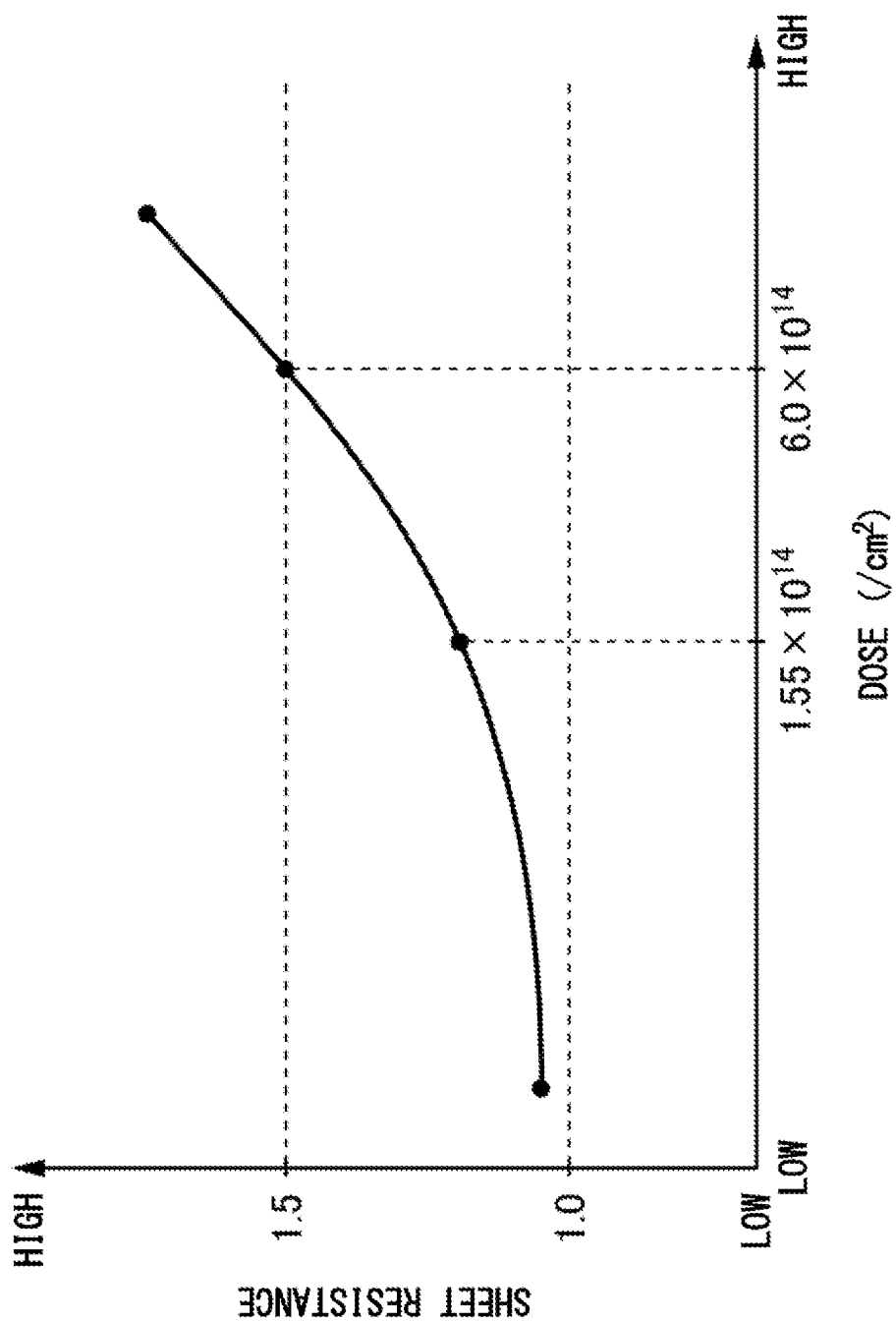
FIG. 4 is a figure showing a relationship between the total dose of impurities into the impurity implantation region 20 and the sheet resistance of the impurity implantation region 20.

FIG. 4 is a figure showing a relationship between the total dose of impurities into the impurity implantation region 20 and the sheet resistance of the impurity implantation region 20. In the example of FIG. 4, whether sheet resistances are suitable for a semiconductor element is judged based on results of Hall measurement. The vertical axis in FIG. 4 corresponds to the highest value of the symmetry factor of Hall measurement. If the highest value is equal to or lower than 1.5, a sheet resistance suitable for a semiconductor element is attained. The lowest value of the vertical axis in FIG. 4 is 1. In addition, in the present example, aluminum ions were used as impurities. However, the same applies to other impurities such as nitrogen, phosphorus, arsenic or boron. In addition, the SiC semiconductor layer 10 was placed in a room temperature atmosphere and impurities were implanted.

As shown in FIG. 4, if the total dose exceeds $6.0 \times 10^{14}/cm^2$, the sheet resistance exceeds a suitable value. Because of this, the total dose of impurities to the impurity implantation region 20 is preferably equal to or lower than $6.0 \times 10^{14}/cm^2$. The total dose of impurities to the impurity implantation region 20 may be equal to or lower than $1.55 \times 10^{14}/cm^2$. In this case, crystal defects increase little or crystal defects are very few as compared with a case where the total dose is $6.0 \times 10^{14}/cm^2$. The lower limit of the total dose may be $1.0 \times 10^{11}/cm^2$, may be $1.0 \times 10^{12}/cm^2$ or may be $1.0 \times 10^{13}/cm^2$.

Figure 5:
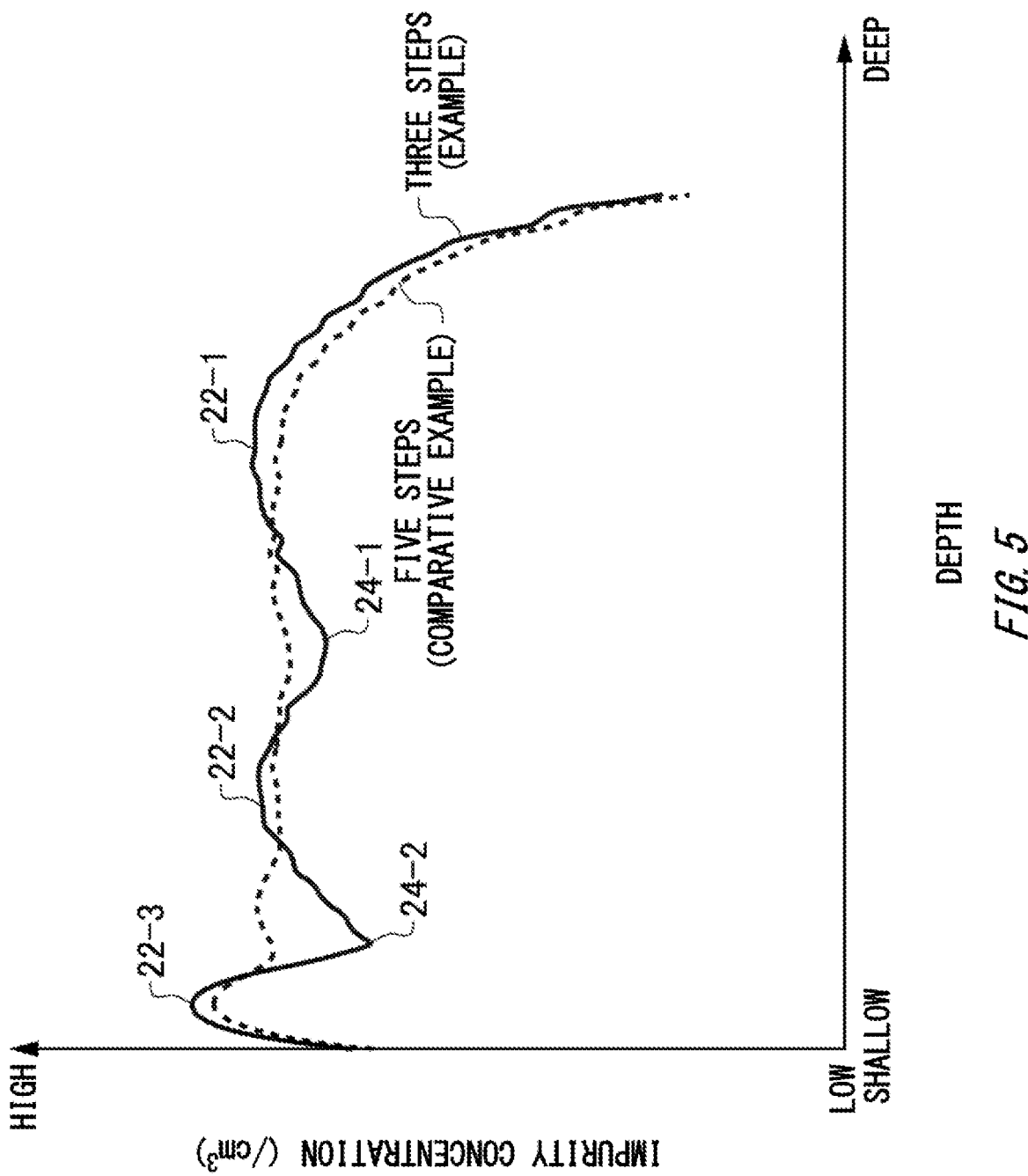
FIG. 5 is a figure showing impurity concentration distributions in an example and a comparative example.

FIG. 5 is a figure showing impurity concentration distributions in an example and a comparative example. The vertical axis in FIG. 5 is a logarithmic axis. In the example, the SiC semiconductor layer 10 was arranged in a room temperature atmosphere, and aluminum ions were implant to three levels of depth. In the comparative example, the SiC semiconductor layer 10 was heated to 500° C., and in this state, aluminum ions were implanted to five levels of depth. In each of the example and the comparative example, the total dose was $1.7 \times 10^{13}/cm^2$.

As shown in FIG. 5, at the positions of the respective peaks 22 in the example, the impurity concentrations are higher than those in the comparative example. On the other hand, at the positions of the valleys 24, the impurity concentrations are lower in the example than those in the comparative example.

Figure 6:
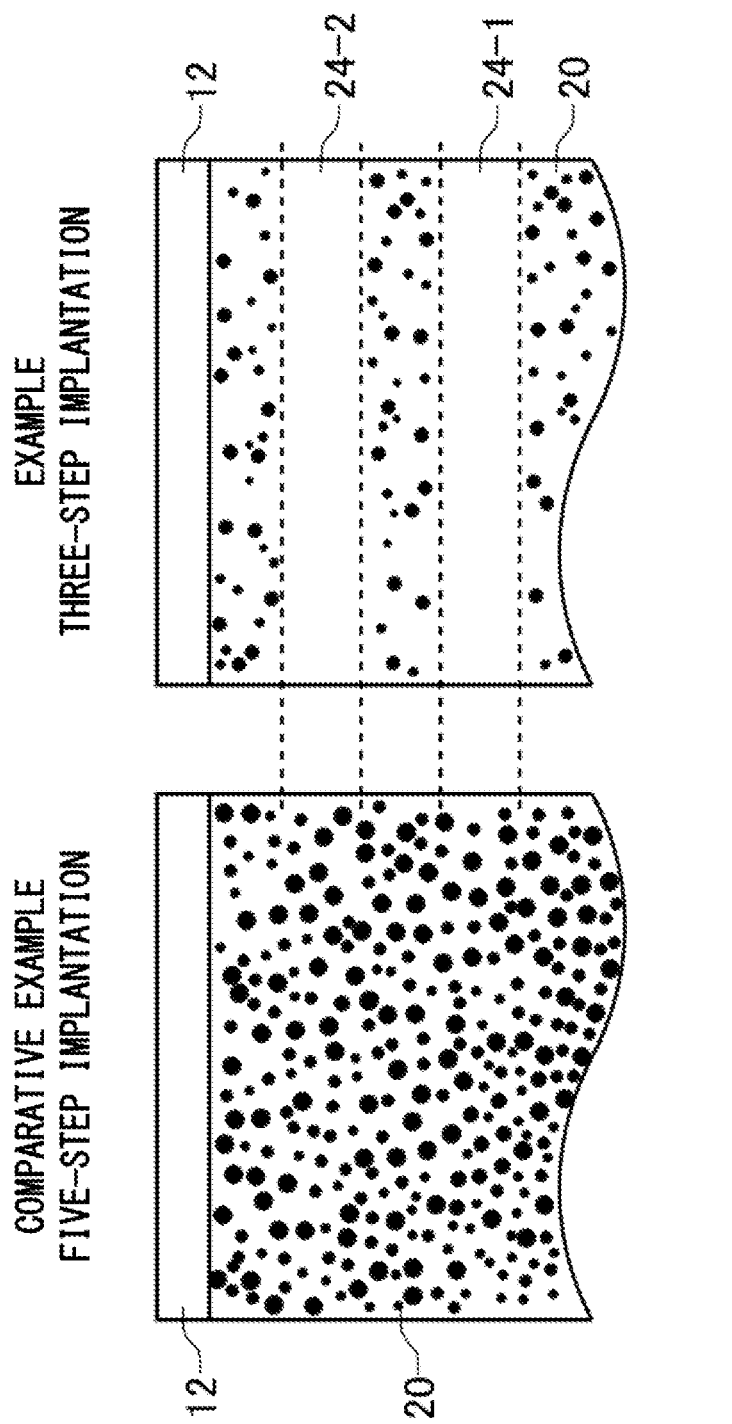
FIG. 6 is a schematic diagram showing crystal defects in the impurity implantation region 20 in the example and the comparative example.

FIG. 6 is a schematic diagram showing crystal defects in the impurity implantation region 20 in the example and the comparative example. Black circles in the impurity implantation region 20 indicate crystal defects. FIG. 6 schematically shows a photograph of a cross-section of the impurity implantation region 20 taken with a transmission electron microscope. As shown in FIG. 6, in the example in which impurities are implanted at three steps in a room temperature atmosphere, generation of crystal defects in the regions of the valleys 24 is suppressed. In addition, also in regions other than the valleys 24, crystal defects are relatively few. As shown in FIG. 6, even if the total doses of impurities are the same, generation of crystal defects can be suppressed by reducing the steps of implantation of impurities.

Figure 7:
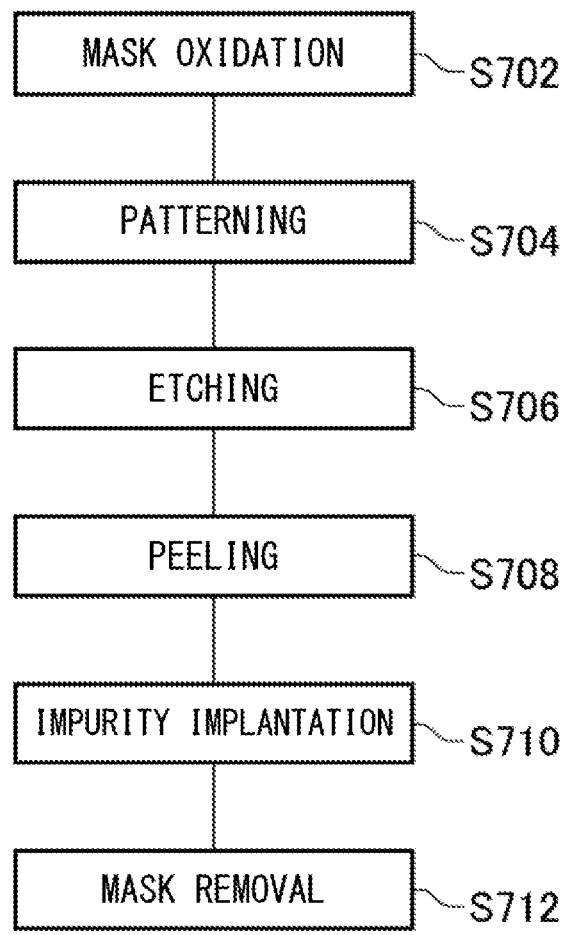
FIG. 7 is a figure showing an example process of implanting impurities into an impurity implantation region among processes of manufacturing a semiconductor device according to the comparative example.

FIG. 7 is a figure showing an example process of implanting impurities into an impurity implantation region among processes of manufacturing a semiconductor device according to the comparative example. In the comparative example, because a SiC semiconductor layer is heated to approximately 500° C., and then impurities are implanted, a highly heat-resistant mask needs to be formed. First, at a mask oxidation step S702, the upper surface of the SiC semiconductor layer is oxidized to form an oxide film.

Next, at a patterning step S704, a resist is formed on the oxide film, and patterning is performed on the resist by exposure, development or the like. Next, at an etching step S706, the oxide film is etched using the resist as a mask. Next, at a peeling step S708, the resist on the oxide film is removed.

Next, at an impurity implantation step S710, the SiC semiconductor layer is heated to approximately 500° C., and in this state, the impurities are implanted to the SiC semiconductor layer using the oxide film as a mask. After implanting impurities, temperature of the SiC semiconductor layer is lowered to room temperature. Next, at a mask removal step S712, the oxide film mask is removed.

In this manner, because in the semiconductor device according to the comparative example, impurities are implanted at a high temperature, it takes time to raise or lower temperature. In addition, because a highly heat-resistant oxide film or the like is used as a mask, it also takes time for a process of performing patterning on a mask.

In contrast to this, in the process of manufacturing the semiconductor device 100 shown in FIG. 2, there is no time or there is a very short time for raising or lowering temperature of the SiC semiconductor layer 10. In addition, because a less heat-resistant resist can be used as a mask, the process for performing patterning on the mask can be performed in a short time. Because of this, the efficiency of manufacturing the semiconductor device 100 can be improved.

Figure 8:
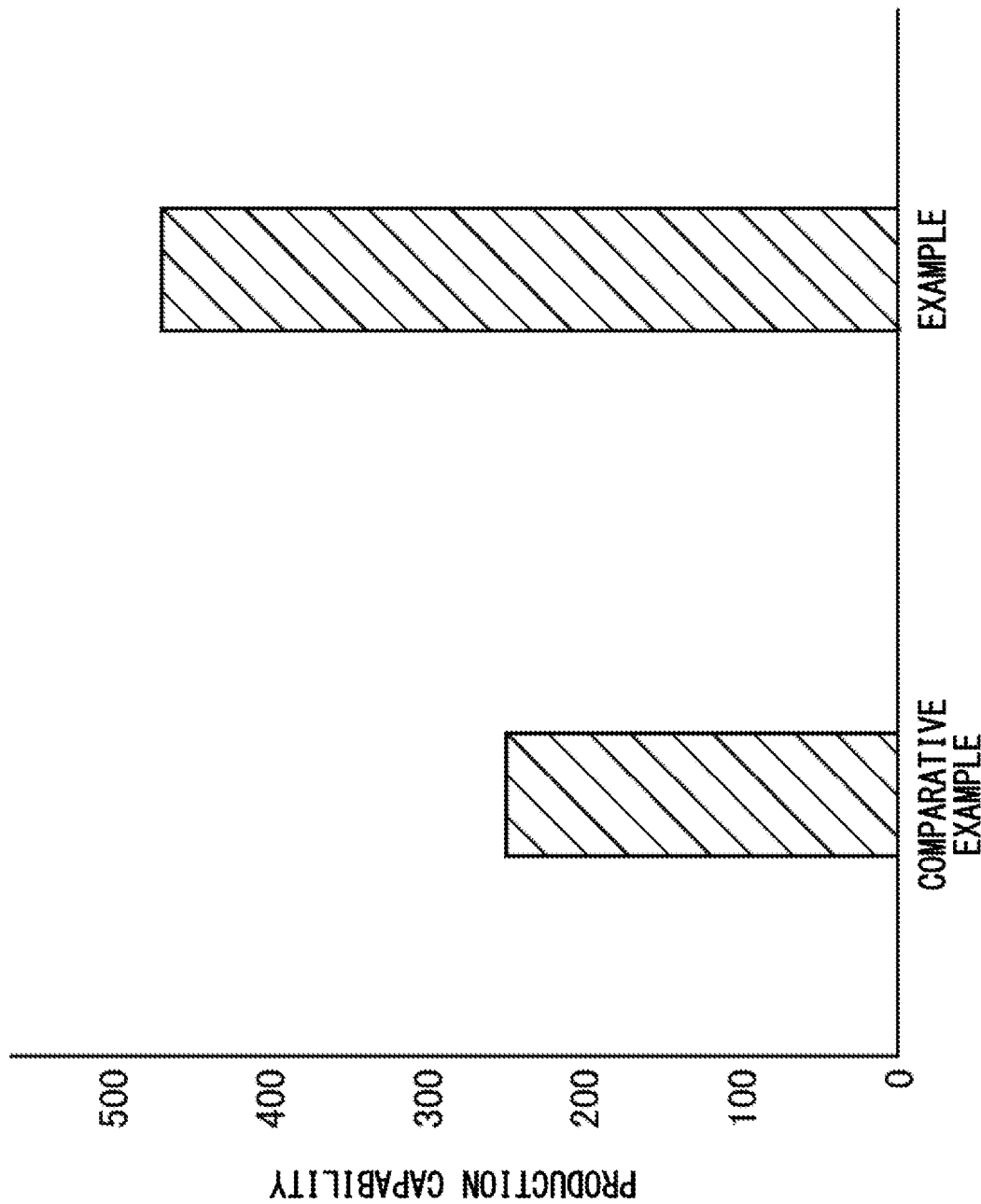
FIG. 8 is a figure for comparing the manufacturing efficiency at the impurity implantation processes in the comparative example and the example.

FIG. 8 is a figure for comparing the manufacturing efficiency at the impurity implantation processes in the comparative example and the example. The vertical axis of FIG. 8 indicates the quantities of semiconductor devices on which impurity implantation processes can be performed within a unit period of time if equivalent apparatus are used. As shown in FIG. 8, the impurity implantation process can be performed on the semiconductor device 100 according to the example approximately twice as efficiently as that on the semiconductor device according to the comparative example.

While the embodiment(s) of the present invention has (have) been described, the technical scope of the invention is not limited to the above described embodiment(s). It is apparent to persons skilled in the art that various alterations and improvements can be added to the above-described embodiment(s). It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE SYMBOLS

10: SiC semiconductor layer; 12: electrode; 20: impurity implantation region; 22: peak; 24: valley; 100: semiconductor device

What is claimed is:

1. A method of manufacturing a semiconductor device including a silicon carbide semiconductor layer, the method comprising:
    implanting impurities multiple times N to an impurity implantation region in the silicon carbide semiconductor layer to different depths, with temperature of the silicon carbide semiconductor layer being set to be equal to or lower than 150° C., wherein
    an impurity concentration distribution in a depth direction of the impurity implantation region to which the impurities are implanted in the implanting has a plurality of peaks and a plurality of valleys, the number of the plurality of peaks being N and
    an impurity concentration of a peak that is deepest as seen from the implantation surface of the silicon carbide semiconductor layer to which the impurities are implanted is higher than an impurity concentration of a second deepest peak.

2. The method of manufacturing according to claim 1, wherein in the implanting, impurities are implanted multiple times to the impurity implantation region to different depths, with temperature of the silicon carbide semiconductor layer being set to be equal to or higher than room temperature.

3. The method of manufacturing according to claim 2, wherein in the implanting, impurities are implanted multiple times to the impurity implantation region to different depths, with the silicon carbide semiconductor layer being arranged in a room temperature atmosphere.

4. The method of manufacturing according to claim 1, wherein in the implanting, impurities are implanted such that an impurity concentration of the impurity implantation region becomes equal to or higher than $1.0 \times 10^{16}/cm^3$ and equal to or lower than $5.0 \times 10^{19}/cm^3$.

5. The method of manufacturing according to claim 4, wherein in the implanting, impurities are implanted such that the impurity concentration of the impurity implantation region becomes equal to or lower than $1.0 \times 10^{18}/cm^3$.

6. A method of manufacturing a semiconductor device including a silicon carbide semiconductor layer, the method comprising:
    implanting impurities multiple times to an impurity implantation region in the silicon carbide semiconductor layer to different depths, with temperature of the silicon carbide semiconductor layer being set to be equal to or lower than 150° C., wherein
    an impurity concentration distribution in a depth direction of the impurity implantation region to which the impurities are implanted in the implanting has a plurality of peaks and a plurality of valleys, and
    a proportion of an impurity concentration of a first valley which is among the plurality of valleys and is deepest as seen from an implantation surface of the silicon carbide semiconductor layer to which the impurities are implanted to an impurity concentration of a first peak which is among the plurality of peaks and is deepest as seen from the implantation surface is equal to or higher than 10% and equal to or lower than 60%.

7. A method of manufacturing a semiconductor device including a silicon carbide semiconductor layer, the method comprising:
    implanting impurities multiple times to an impurity implantation region in the silicon carbide semiconductor layer to different depths, with temperature of the silicon carbide semiconductor layer being set to be equal to or lower than 150° C., wherein
    an impurity concentration distribution in the depth direction of the impurity implantation region to which the impurities are implanted at the implanting has a plurality of peaks and a plurality of valleys, and
    an interval $d_p$ in the depth direction between respective peaks in the impurity concentration distribution satisfies the following equation:

$$0.1 \le \exp\left(-\frac{d_p^2}{2(\sigma_1 + \sigma_2)^2}\right) \le 0.6$$

where a standard deviation of the impurity concentration distribution of a peak that is among two adjacent peaks and is on a deeper side in the depth direction is $\sigma_1$, and a standard deviation of the impurity concentration distribution of a peak that is among the two adjacent peaks and is on a shallower side in the depth direction is $\sigma_2$.

8. The method of manufacturing according to claim 1, wherein
    intervals, in the depth direction, between respective peaks in the impurity concentration distribution increase as depths of the peaks as seen from an implantation surface of the silicon carbide semiconductor layer to which the impurities are implanted increase.

9. The method of manufacturing according to claim 1, wherein a total dose of impurity implantation in the implanting is equal to or lower than $6.0 \times 10^{14}/cm^2$.

10. The method of manufacturing according to claim 9, wherein the total dose of impurity implantation in the implanting is equal to or lower than $1.55 \times 10^{14}/cm^2$.

11. The method of manufacturing according to claim 1, wherein
    a depth of a first peak that is among the plurality of peaks and is deepest as seen from the implantation surface of the silicon carbide semiconductor layer to which the impurities are implanted is equal to or larger than 0.2 μm and equal to or smaller than 1.0 μM.

12. The method of manufacturing according to claim 1, comprising, prior to the implanting, forming, above the silicon carbide semiconductor layer, a resist mask in a shape corresponding to the impurity implantation region.

13. The method of manufacturing according to claim 1, wherein impurities are implanted such that impurity concentrations of impurities implanted in the implanting are equal to or higher than $1.0 \times 10^{16}/cm^3$ and equal to or lower than $5.0 \times 10^{19}/cm^3$ at all peaks and valleys.

* * * * *